(12) United States Patent
Robitaille

(10) Patent No.: US 6,255,816 B1
(45) Date of Patent: Jul. 3, 2001

(54) ELECTROMAGNETIC RESONATOR DEVICES AND SYSTEMS INCORPORATING SAME, RESONANCE AND IMAGING METHODS

(75) Inventor: Pierre-Marie L. Robitaille, Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 09/175,608

(22) Filed: Oct. 20, 1998

(51) Int. Cl.⁷ ........................................... G01V 3/00
(52) U.S. Cl. ............................... 324/300; 324/309
(58) Field of Search .................... 324/318, 314, 324/309, 300

(56) References Cited

U.S. PATENT DOCUMENTS

| | | | |
|---|---|---|---|
| 4,087,738 | * 5/1978 | Van Degrift et al. | 324/0.5 A |
| 4,694,255 | 9/1987 | Hayes | 324/318 |
| 4,746,866 | 5/1988 | Roschmann | 324/318 |
| 5,107,215 | * 4/1992 | Schaefer et al. | 324/314 |
| 5,557,247 | 9/1996 | Vaughn, Jr. | 333/219 |
| 5,744,957 | * 4/1998 | Vaughan | 324/318 |

* cited by examiner

*Primary Examiner*—Jay Patidar
*Assistant Examiner*—Brij B. Shrivastav
(74) *Attorney, Agent, or Firm*—Standley & Gilcrest LLP

(57) ABSTRACT

The present invention includes electromagnetic resonators, a electromagnetic resonator devices, and electromagnetic resonance systems. The invention also includes analytical or diagnostic machines or instruments using those these aspects of the invention. The present invention also includes several analytical, diagnostic and testing methods and processes using the devices of the present invention.

18 Claims, 10 Drawing Sheets

ELECTROMAGNETIC RESONATOR DEVICES AND SYSTEMS INCORPORATING SAME, RESONANCE AND IMAGING METHODS

The present invention arose through work supported in part by National Institute of Health (NIH) Grant No. HL45120. The United States Government may have certain rights to this invention under 35 U.S.C. Section 200 et seq.

TECHNICAL FIELD OF THE INVENTION

The present invention is in the field of magnetic resonance spectroscopy and imaging.

BACKGROUND OF THE INVENTION

This invention relates to magnetic resonance apparatus useful in nuclear magnetic resonance (NMR), magnetic resonance imaging (MRI) and electron spin resonance (ESR) devices. More specifically, this invention relates to electromagnetic frequency resonators useful in those apparatus for transmitting and/or receiving RF signals.

In the past, the NMR and ESR phenomenon have been utilized by structural chemists and physicists to study, in vitro, the molecular structure of atoms and molecules. Typically, NMR and ESR spectrometers utilized for this purpose were designed to accommodate relatively small samples of the substance to be studied.

More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons and/or neutrons (i.e., a quantum mechanical asymmetry in the nucleus). Due to the spin of the protons and neutrons, each such nucleus exhibits a magnetic moment, such that, when a sample composed of such nuclei is placed in a static, homogeneous magnetic field, $B_0$, a greater number of nuclear-magnetic moments align with the field to produce a net macroscopic magnetization M in the direction of the field. Under the influence of the magnetic field $B_0$, the magnetic moments precess about the axis of the field at a frequency which is dependent on the strength of the applied magnetic field and on the characteristics of the nuclei. The angular precession frequency, w, also referred to as the Larmor Frequency, is given by the equation $w=g B$, in which g is the gyromagnetic ratio (which is constant for each NMR isotope) and wherein B is the magnetic field ($B_0$ plus other fields) acting upon the nuclear spins. It will be thus apparent that the resonant frequency is dependent on the strength of the magnetic field in which the sample is positioned.

The orientation of magnetization M, normally directed along the magnetic field $B_0$, may be perturbed by the application of magnetic fields oscillating at or near the Larmor frequency. Typically, such magnetic fields designated $B_1$ are applied orthogonal to the direction of magnetization M by means of radio-frequency pulses through a coil connected to radio-frequency-transmitting apparatus. Magnetization M rotates about the direction of the $B_1$ field. In NMR, it is typically desired to apply RF pulses of sufficient magnitude and duration to rotate magnetization M into a plane perpendicular to the direction of the $B_0$ field. This plane is commonly referred to as the transverse plane. Upon cessation of the RF excitation, the nuclear moments rotated into the transverse plane begin to realign with the $B_0$ field by a variety of physical processes. During this realignment process, the nuclear moments emit radio-frequency signals, termed the NMR signals, which are characteristic of the magnetic field and of the particular chemical environment in which the nuclei are situated. The same or a second RF coil may be used to receive the signals emitted from the nuclei. In NMR imaging applications, the NMR signals are observed in the presence of magnetic-field gradients which are utilized to encode spatial information into the NMR signal. This information is later used to reconstruct images of the object studied in a manner well known to those skilled in the art.

In performing whole-body NMR studies, it has been found advantageous to increase the strength of the homogeneous magnetic field $B_0$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in w and, hence, in the resonant frequency of the transmitter and receiver coils. This complicates the design of RF coils which are large enough to accommodate the human body. One source of difficulty is that the RF field generated by the coil should be typically homogeneous over the body region to be studied. Another complication arises from the intrinsic distributed inductance and capacitance in such large coils which limit the highest frequency at which the coil can be made to resonate.

It is therefore an object of the invention to provide an electromagnetic resonance coil (e.g., an NMR, ESR on MRI coil). which is operable at lower power and/or which exhibits an improved signal-to-noise ratio, as desired for particular applications.

Although described with respect to the fields of NMR and MRI, it will be appreciated that similar advantages of lower power requirements and/or improved signal-to-noise ratio, as well as other advantages, may obtain in other applications of the present invention. Such advantages, may become apparent to one of ordinary skill in the art in light of the present disclosure or through practice of the invention.

SUMMARY OF THE INVENTION

The present invention includes electromagnetic resonators, a electromagnetic resonator devices, and electromagnetic resonance systems. The invention also includes analytical or diagnostic machines or instruments using those these aspects of the invention. Those analytical or diagnostic machines or instruments may include nuclear magnetic resonance (NMR) devices (for both liquid and solid state matter), electron spin resonance (ESR) devices, and magnetic resonance imaging (MRI) devices, of any type and as used for any purpose. The present invention may also be used to upgrade, repair or retrofit existing analytical or diagnostic machines or instruments of these types, using methods in components known in the art.

The present invention also includes analytical, diagnostic and testing methods and processes using the devices of the present invention. Examples of these methods include NMR (both liquid and solid state), ESR and MRI, as applied to any of the wide variety of matter in any of the physical states (including living and non-living tissue and organisms) to which these methods and processes have been or might be applied. The methods and processes of the present invention may be applied using procedures and protocols known and used in the arts to which they pertain.

In broadest terms, the electromagnetic resonator of the present invention comprises: (1) a sealed resonance cavity comprising at least one electromagnetic radiation port adapted to allow the passage of electromagnetic energy into and out of the cavity; and (2) at least one impedance matching element. In magnetic resonance applications, the electromagnetic resonator in use is disposed in proximity or within is a magnet such that the cavity is under the influence of the magnetic field.

As used herein, the term "sealed" refers to and should be understood as meaning the characteristics of a resonance cavity that is closed or otherwise obstructed so as to substantially reduce the amount of radiation emitting from the resonance cavity. It is preferred that radiation be substantially completely obstructed, and most preferably completely obstructed, by providing an effective radiation barrier.

The sealed resonance cavity container may be made of any appropriate material consistent with its intended function as reflected in the present disclosure. The resonance cavity container is sealed in that it effectively prevents the resonator from radiating externally. The resonance cavity container may be made in any shape depending on factors such as the desired electromagnetic environment produced by the resonance element as it is intended to influence the target sample or phantom. For instance, the residence cavity container may be made of, or be coated or embedded or laminated with, one or more appropriate electromagnetic radiation opaque materials such as metals like silver or copper, for example. For instance, the resonance cavity may be formed by an acrylic structure, generally defining the resonance cavity, with lamination of copper sheeting on its interior surfaces.

The sealed resonance cavity container comprises one or more electromagnetic radiation ports adapted to allow the passage of electromagnetic energy into and out of the resonance cavity. The electromagnetic port(s) preferably is/are the only functional passageway for electromagnetic energy flowing through them to and from the resonance cavity.

The impedance matching element(s) is/are adapted to match the impedance of the resonance cavity (or resonance element(s) where used) to the impedance of the electromagnetic energy power source and/or the receiver. This may be done through capacitance, inductance, or a combination thereof, in accordance with electrical circuits and components known and used in the art.

The resonance element(s) may be of any type appropriate to the desired application of the invention. The resonance element(s) may be untuned (i.e., where no resonance elements are present), tuned or multiply tuned. For instance, the resonant device may be a transverse electromagnetic (TEM) coil, such as those described by Vaughn, Jr. in U.S. Pat. No. 5,557,247 or Röschman et al. in U.S. Pat. No. 4,746,866; or a bird-cage-type resonator described in U.S. Pat. No. 4,694,255 to Hayes. All of the aforementioned patents are hereby incorporated herein by reference in their entirety. Indeed, electromagnetic resonators, devices and systems to the present invention may be obtained by modifying prior art devices of these and other types to provide a sealed resonance cavity, in light of the disclosure and examples contained herein.

The impedance matching element(s) is/are adapted to match the impedance of the resonance element(s) to the impedance of the electromagnetic energy power source. This may be done through capacitance or inductance, in accordance with electrical circuits known and used in the art.

The present invention also includes an electromagnetic resonator device utilizing electromagnetic resonator of the present invention. The electromagnetic resonator device of the present mention comprises, in general terms: (1) a sealed resonance cavity comprising at least one electromagnetic radiation port adapted to allow the passage of electromagnetic energy into and out of said cavity (as described herein); and (2) at least one impedance matching element (as described herein); and (3) a source of electromagnetic energy to supply said cavity with electromagnetic energy.

The source of electromagnetic energy which may be used in the electromagnetic resonator device of the present invention may be any source electromagnetic energy appropriate to the particular use to which the invention will be put, and may be selected from any of those commonly known and applied in the areas fields of NMR, ESR and MRI. The sources may include, for example, sources of radio frequencies, microwaves, or other wavelengths, depending on the type and magnitude of the target energetic transition that is to occur within the target sample, phantom, analyte, tissue or organism.

The present invention also includes several analytical or diagnostic machines or instruments incorporating the electromagnetic resonator, electromagnetic resonator device, or electromagnetic resonator system of the present invention. Those instruments or machines may include nuclear magnetic resonance instruments, electronic spin resonance instruments, and magnetic resonance imaging instruments. The present inventions may be used in these instruments in accordance with methods, arrangements and components as applied in the art. Accordingly, the present invention includes NMR (both liquid and solid state), ESR and MRI devices and systems that incorporate any of the invention is described herein.

The present invention also includes several analytical, diagnostic and testing methods and processes using the devices of the present invention. These devices may be made from existing devices retrofit with devices on systems of the present invention.

For example, the present invention includes, in general terms, a method of measuring nuclear magnetic resonance in a substance comprising the steps: (1) placing a substance comprising nuclei i(i.e. having a quantum mechanical asymmetry) in a sealed resonance cavity; (2) within a magnetic field so as to orient the magnetic moment of the nuclei along a first vector; (3) irradiating the nuclei with electromagnetic radiation so as to change the orientation of the magnetic moment of the nuclei from the first vector to a second vector; (4) allowing the magnetic moment to reorient along the first vector so as to release energy; and (5) measuring energy selected from the group consisting of energy absorbed in step (3), the energy released in step (4), or both.

Also included present invention is, in broadest terms, a method of measuring electron spin resonance in a substance comprising the steps: (1) placing a substance comprising unpaired electrons in a sealed resonance cavity; (2) producing a magnetic field so as to orient the spin alignment of the unpaired electrons to a first value; (3) irradiating the unpaired electrons with electromagnetic radiation so as to change the orientation of the spin alignment of the electrons to a second value so as to cause an absorption of energy; (4) allowing the orientation of the spin alignment of the electrons to return to the first value so as to release energy and (5) measuring energy selected from the group consisting of energy absorbed in step (3), the energy released in step (4), or both.

These steps may be adapted to the present invention using components and protocols of the prior art and incorporating the sealed resonance cavity of the prior invention.

Magnetic resonance imaging may also be performed to for instance by using the present invention within MRI devices as they are known in used in the art. Generally, the present invention includes method of forming an image of an object through magnetic resonance in, the method comprising the steps: (1) placing an object comprising nuclei in a sealed resonance cavity; (2) producing a magnetic field so as to orient the magnetic moment of the nuclei along a first vector; (3) irradiating the nuclei with electromagnetic radiation so as to change the orientation of the magnetic moment of the nuclei from the first vector to a second vector; (4) allowing the magnetic moment to reorient along the first vector so as to release energy; (5) measuring that energy; and (6) forming an image of said object from the energy measurements.

These steps may be adapted to the present invention using components and protocols of the prior art and incorporating the sealed resonance cavity of the prior invention.

DETAILED DESCRIPTION OF THE PREFERRED EMBODIMENTS

In accordance with the foregoing summary, the following present a detailed description of the preferred embodiment of the invention that is currently considered to be the best mode.

Using an electromagnetic resonator in accordance with a previously known art (Vaughn) intrinsic signal-to-noise (ISNR) and power were examined in a mineral oil phantom at 1.5, 4.0 and 8.0 T for comparison purposes. At 8.0 T, using conventional TEM resonators, both of these quantities were observed to be much less than predicted based on current NMR theory.

In order to shed additional light on RF power requirements and ISNR, an electromagnetic resonator was assembled by constructing a radio frequency coil wherein a 18.5 cm spherical phantom containing mineral oil was completely enclosed within an RF cavity. In this coil, the possibility of radiative losses are completely eliminated. Because an electromagnetic resonator in accordance with the present invention functions essentially as an electronic version of Planck's "black body" radiation model, it is referred to as a "black body resonator."

Figure 1:
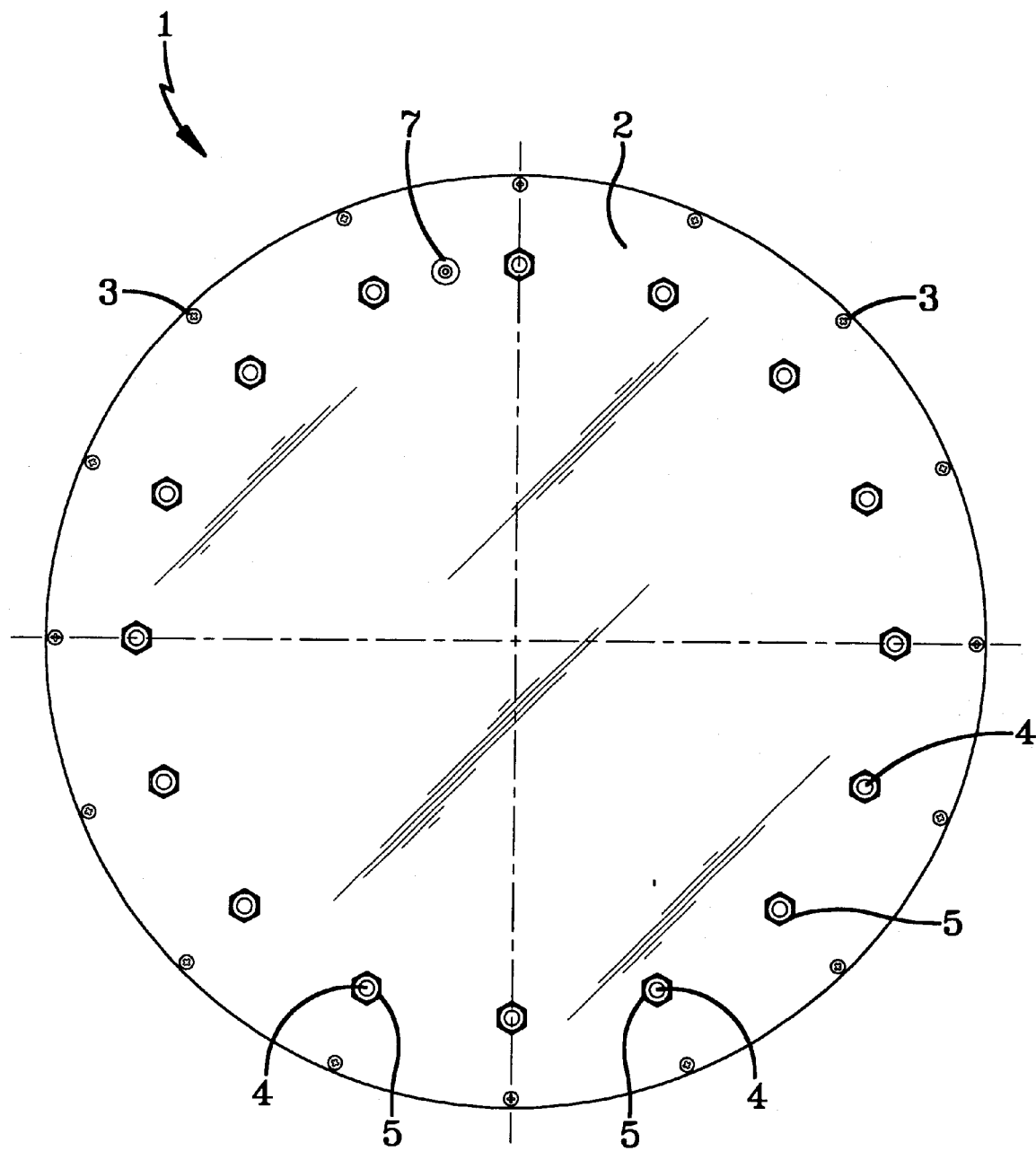
FIG. 1 is a front elevational view of a resonance cavity container that may be used in accordance with one embodiment of the present invention.

FIG. 1 is a front elevational view of a resonance cavity container that may be used in accordance with one embodiment of the present invention. FIG. 1 shows the end of a cylindrical resonator cavity container 1 bearing end cap portion 2 held onto the balance of the resonator by attachment screws 3. FIG. 1 also shows the terminal ends of resonator rods 4 held in position with the aid of nuts 5. Also shown is the electromagnetic energy port in the form of coaxial plug 7.

Figure 2:
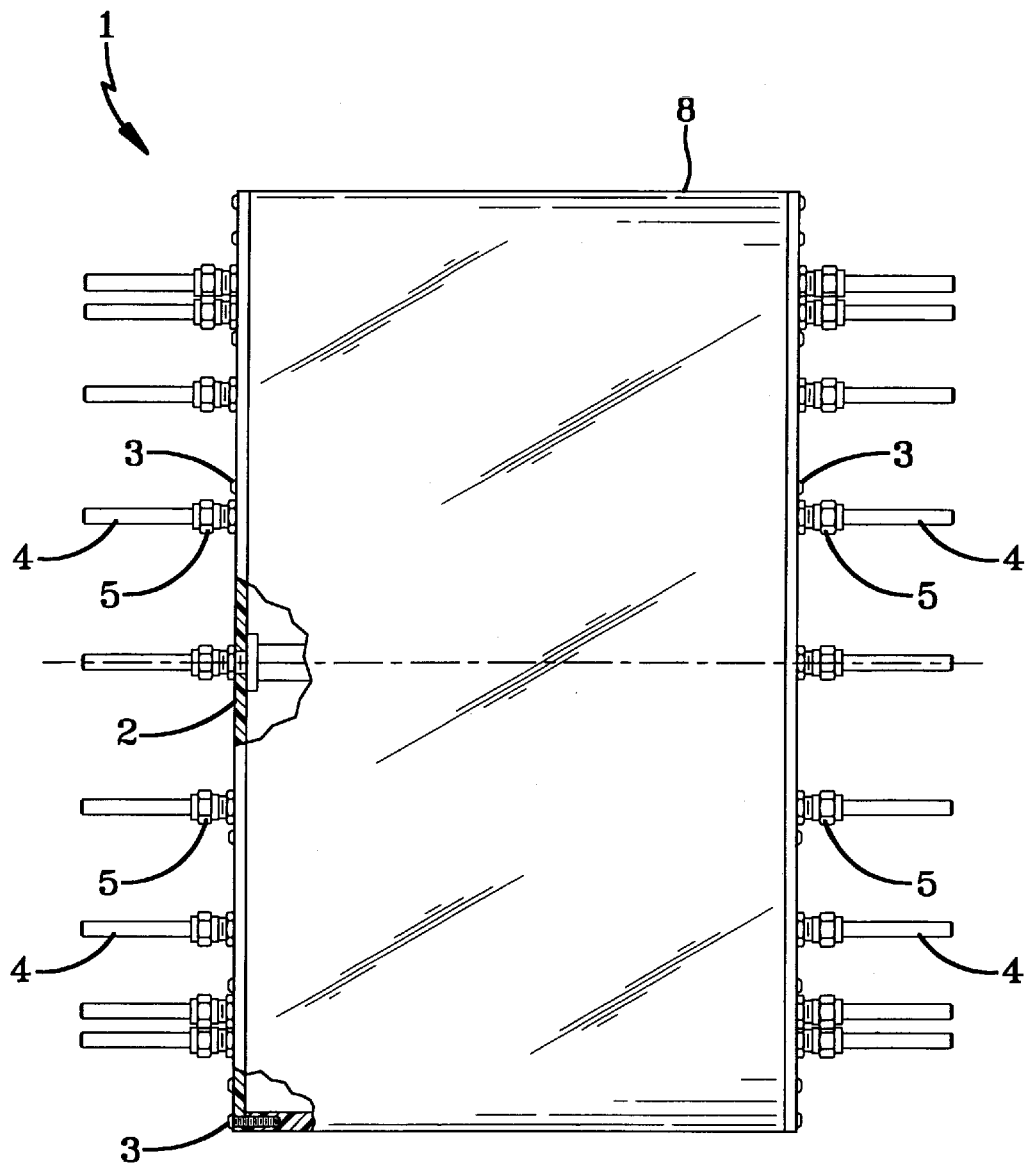
FIG. 2 is a side elevational view of a resonance cavity container that may be used in accordance with one embodiment of the present invention.

FIG. 2 is a side elevational view of a resonance cavity container shown in FIG. 1 with like reference numerals. FIG. 2 also shows the cylindrical body 8 of the resonance cavity container 1.

Figure 3:
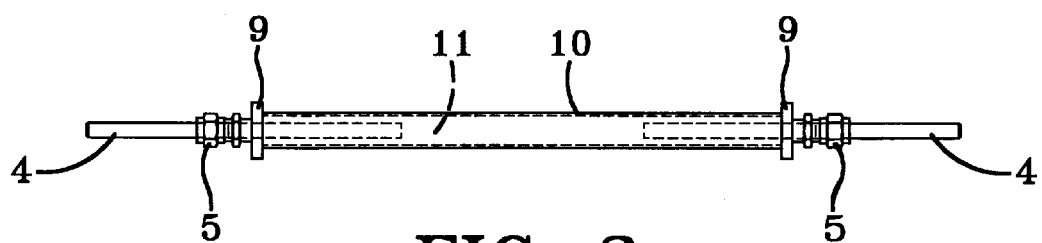
FIG. 3 is a partially phantomed view of one of the resonator rods of the embodiment of the present invention shown in FIGS. 1, 2 and 4.
Figure 4:
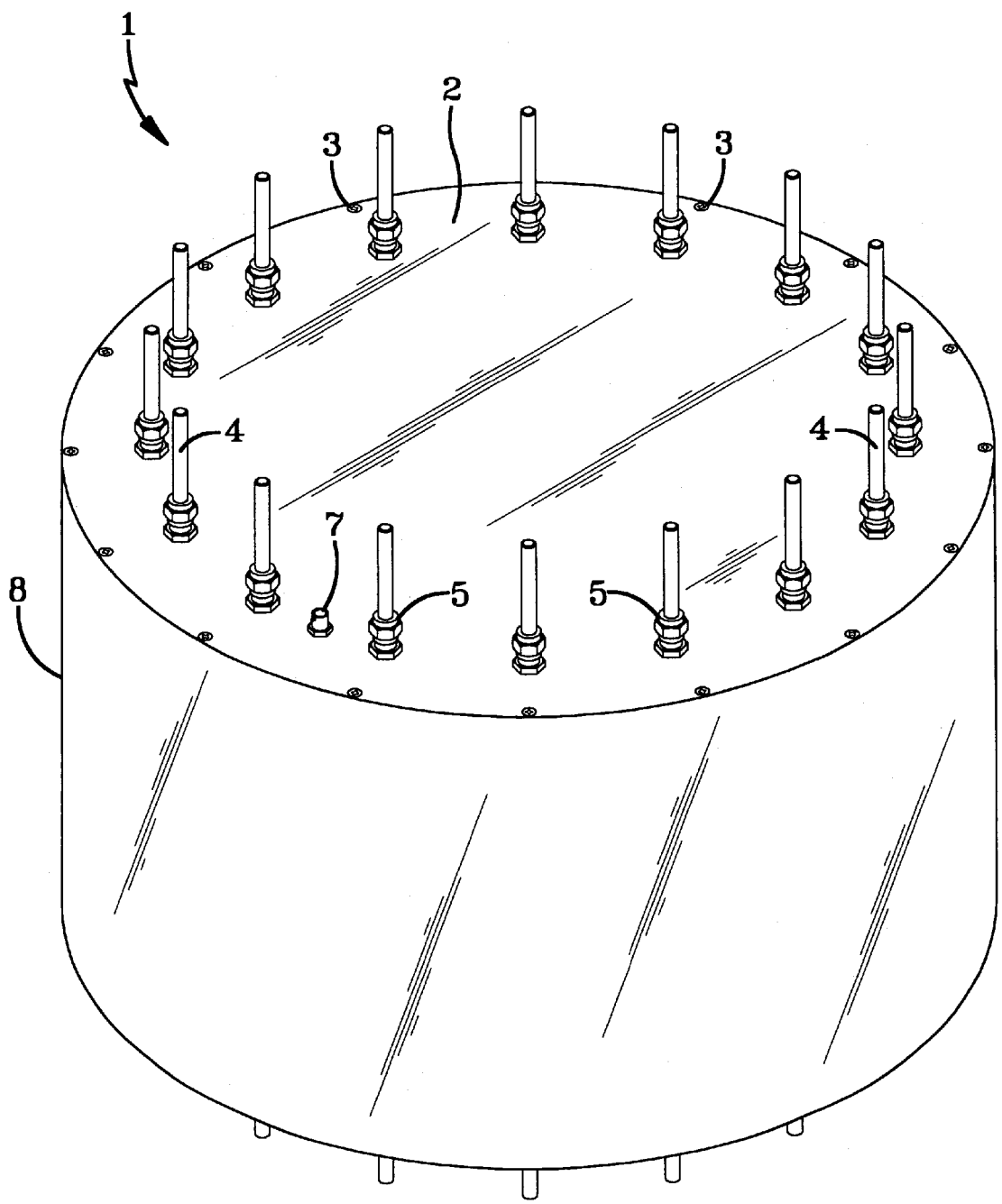
FIG. 4 is a perspective view of a resonance cavity container of the embodiment of the present invention shown in FIGS. 1 and 2.

FIG. 3 is a partially phantomed view of one of the resonator rods of the embodiment of the present invention shown in FIGS. 1, 2 and 4. FIG. 3 shows resonator rod 4 with nut end 5 and washer 9. Also shown is copper sheath 10 and Teflon tube 11.

FIG. 4 is a perspective view of a resonance cavity container 1 shown in FIGS. 1 and 2 with like reference numerals. FIG. 4 shows cylindrical resonator cavity container 1 bearing end cap portion 2 held onto the balance of the resonator by attachment screws 3. FIG. 4 also shows the terminal ends of resonator rods 4 held in position with the aid of nuts 5. Also shown is the electromagnetic energy port in the form of coaxial plug 7.

Figure 8:
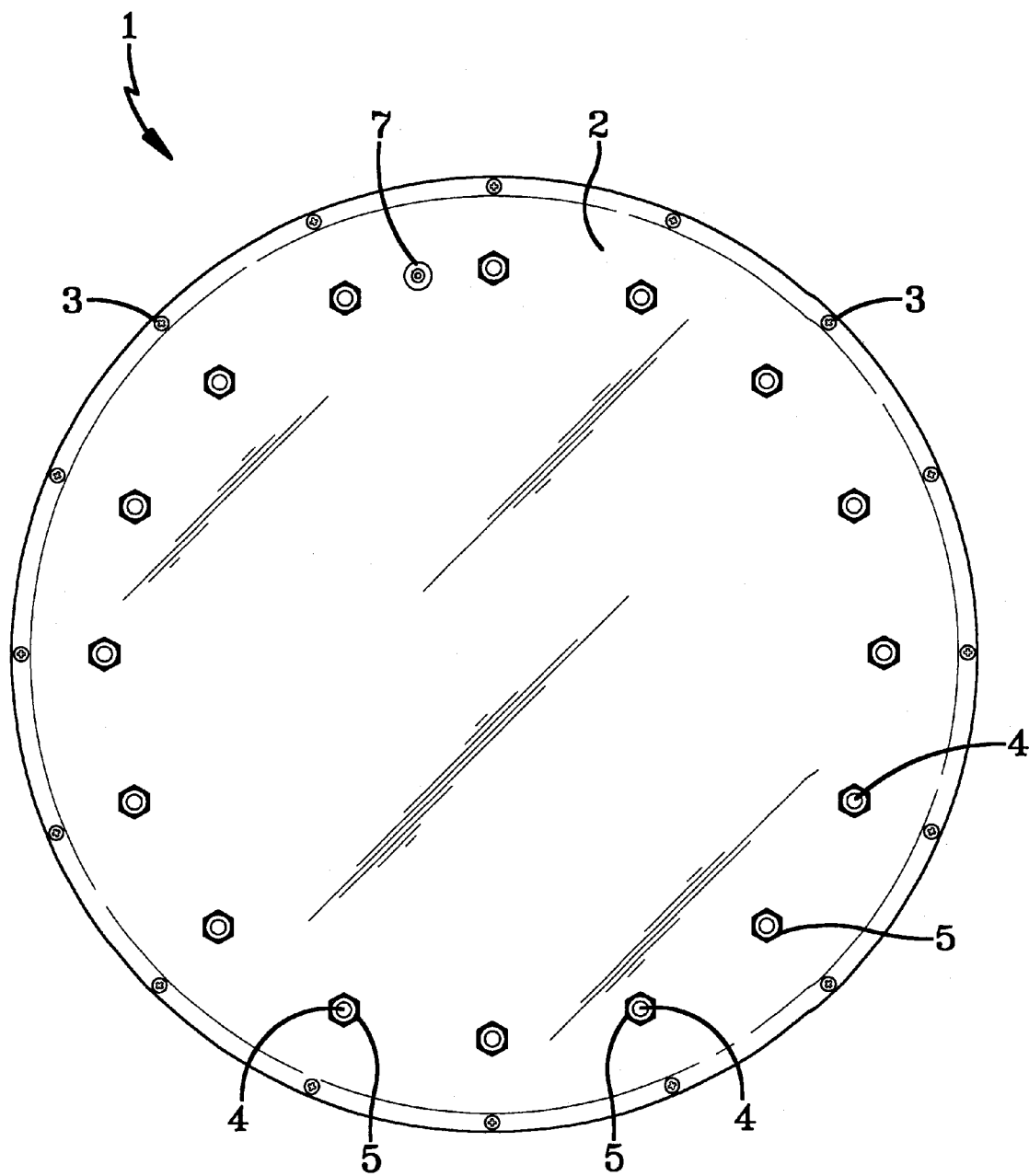
FIG. 8 is a photographic front elevational view of a resonance cavity container that may be used in accordance with one embodiment of the present invention.

FIG. 8 is a photographic front elevational view of a resonance cavity container that may be used in accordance with one embodiment of the present invention. FIG. 8 shows the copper sheet laminated beneath the otherwise clear acrylic structural material from which the resonator cavity container is constructed.

Figure 9:
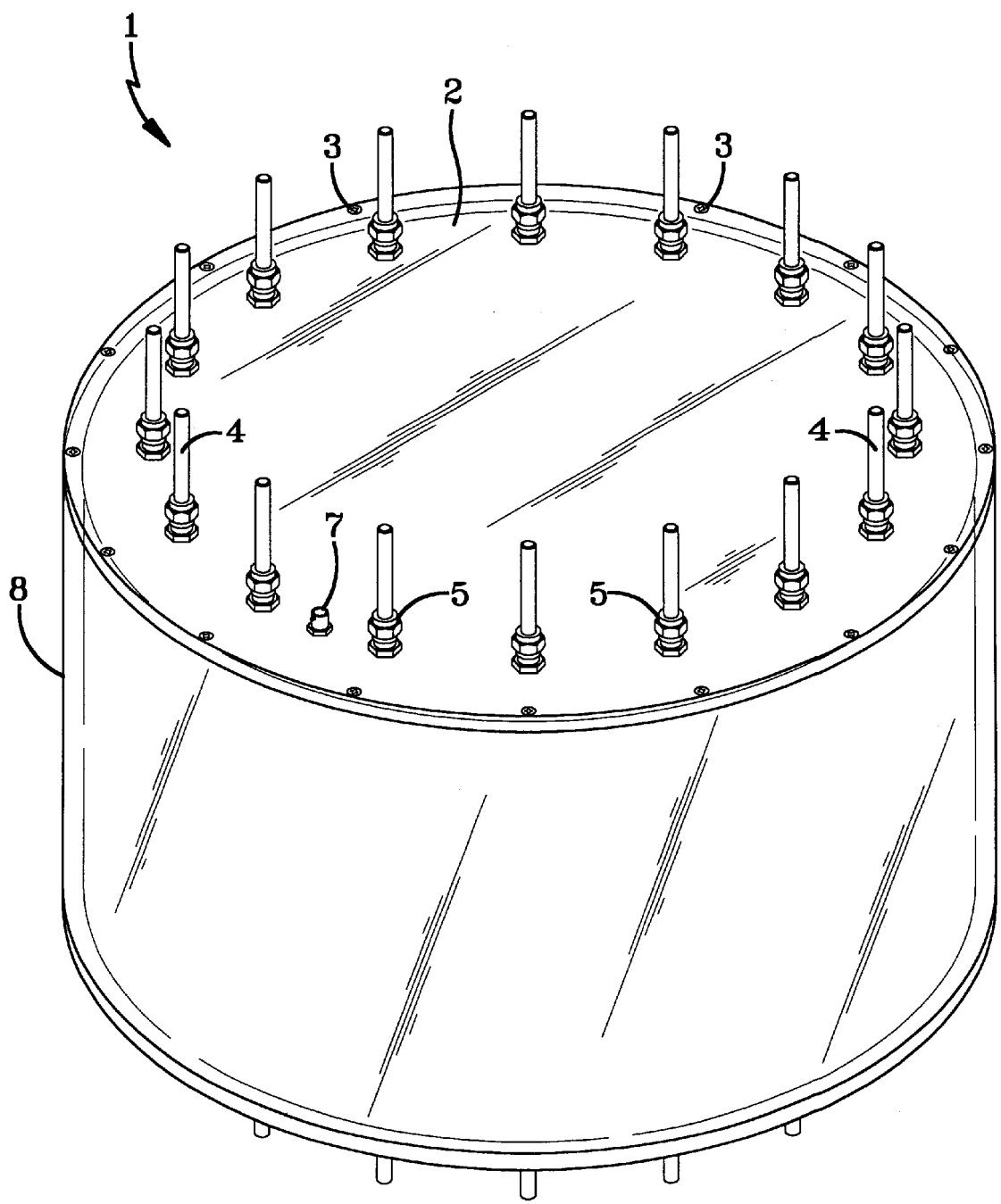
FIG. 9 is a photographic side elevational view of a resonance cavity container that may be used in accordance with one embodiment of the present invention.

FIG. 9 is a photographic side elevational view of a resonance cavity container that may be used in accordance with one embodiment of the present invention. FIG. 9 also shows the copper sheet laminated beneath the otherwise clear acrylic structural material from which the resonator cavity container (including the end cap portions and the cylindrical body portion) is constructed. The copper resonator rods are also visible extending from either end of the resonator cavity container.

Figure 10:
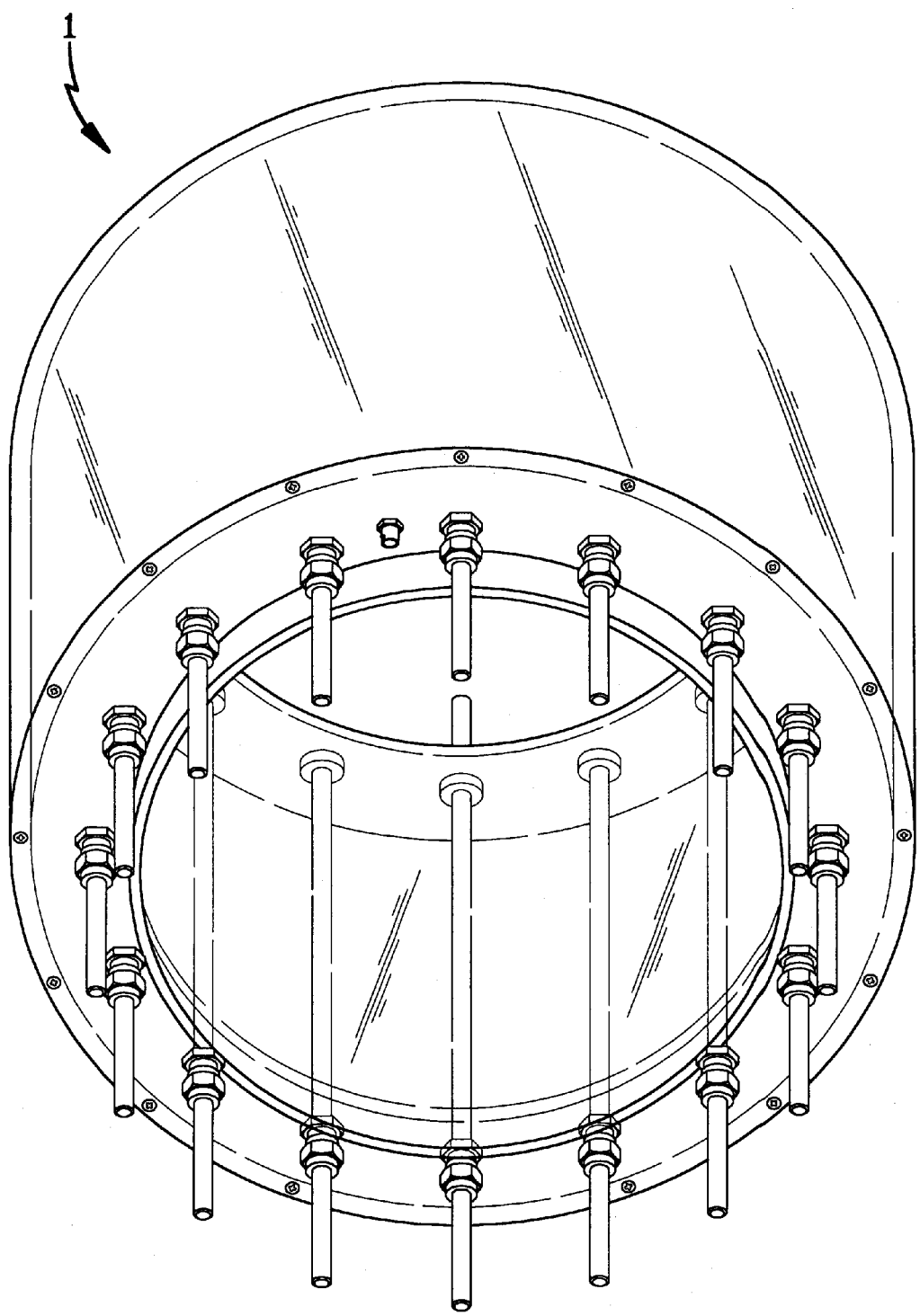
FIG. 10 is a photographic perspective view of a resonance cavity container that may be used in accordance with one embodiment of the present invention, having its end cap portions removed.

FIG. 10 is a photographic perspective view of a resonance cavity container that may be used in accordance with one embodiment of the present invention, having its end cap portion removed.

Figure 11:
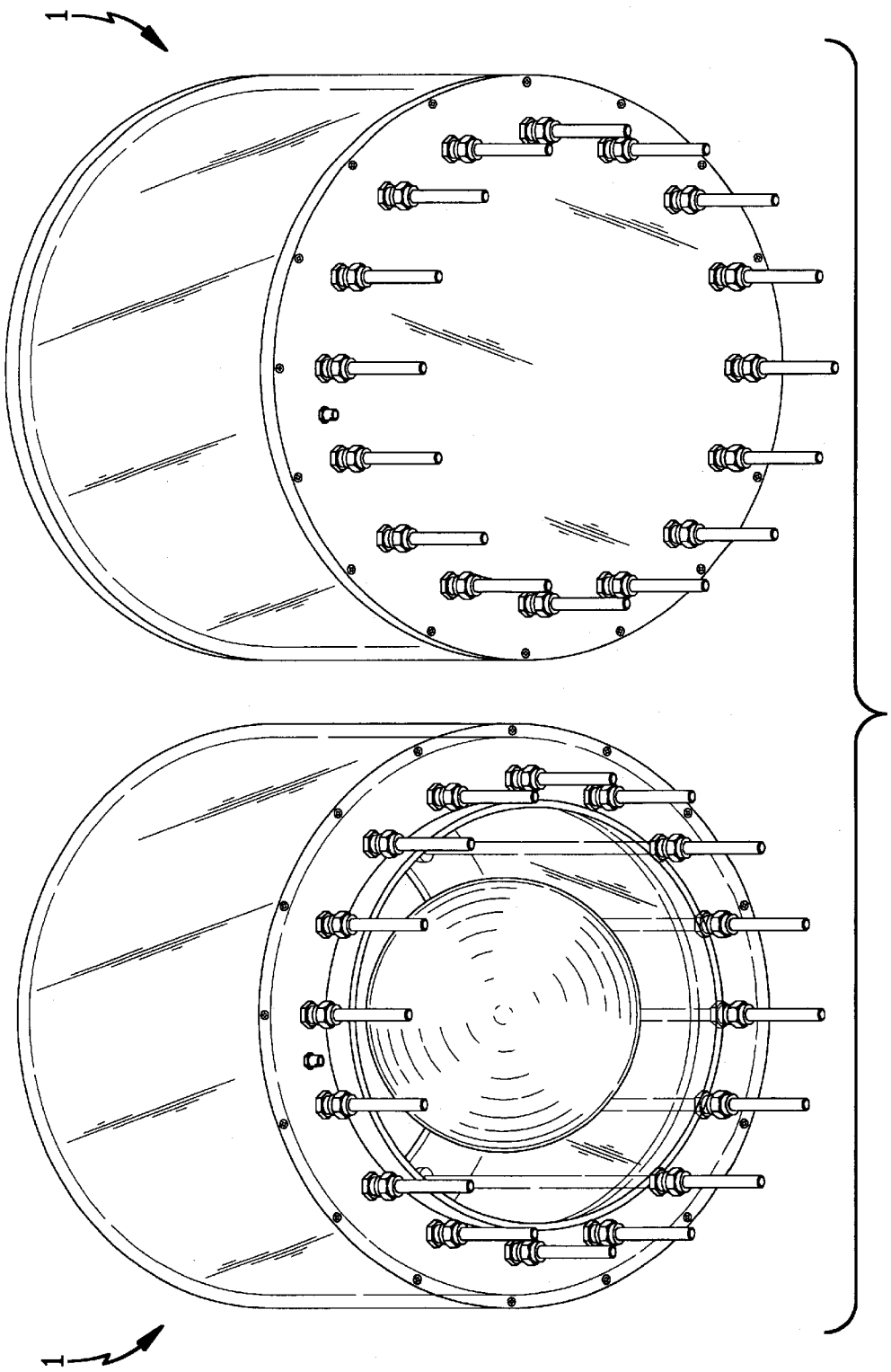
FIG. 11 is a photographic perspective view of two resonance cavity containers that may be used in accordance with one embodiment of the present invention, one having its end cap portions removed and showing the position of a sample-containing bulb; and the other with the end cap portions in place.

FIG. 11 is a photographic perspective view of two resonance cavity containers that may be used in accordance with one embodiment of the present invention, one having its end cap portions removed and showing the position of a sample-containing bulb; and the other with the end cap portion in place.

It was observed that the black body resonator surprisingly required only a few millijoules of energy to produce a 90° pulse. Conversely, common transverse electromagnet (TEM) resonators in accordance with the prior art and of identical dimensions required 240 times (at 4.0 T) as much energy to achieve the same 90° mutation. This dramatic decrease in energy requirements in the black body resonator could not be explained on the basis of improvements in coil quality factors (see Table 1). Nonetheless, the black body resonator of the present invention provided more than 4 times the ISNR as the prior art TEM resonator. When taken in combination, results in the TEM resonator and the black body resonator indicate that ISNR is unrelated to absorbed power under these conditions. In addition, it is demonstrated that ISNR and RF power requirements cannot be predicted based on the principle of reciprocity [20].

Materials and Methods

Measurement of Preamplifier Noise Figures: Noise figures were determined by observing the combined noise performance of the TR switch, preamplifier and receiver chain. This was accomplished by measuring noise from a 50 ohm load (commercially available from Weinschel as Model F1419) connected to the TR switch at both room temperature and liquid nitrogen temperature. Under these conditions, the Bruker receiver chain exhibited a noise figure of 1.68+/−0.21. This is an excellent performance, especially since the TR switch (commercially available from Hill Engineering, Topsfield, Mass.) is rated to have an insertion loss of at least 0.3 dB. In addition, two 50 ohm cables may be inserted between the 50 ohm load and the preamplifier in order to connect the TR switch. For these measurements, a narrow band preamplifier (Advanced Receiver Research, Burlington, Conn.) was utilized. Spectroscopic parameters were as follows (sweep width=30 k; block size=1 k real, 1 k imaginary; receiver gain=maximal).

Receiver Performance: The performance of the receiver chain was also tested by providing a calibrated −120 dBm signal to the input of the TR switch. This corresponds to a 0.001 pWatt signal. A calibrated synthesized signal generator (Hewlett Packard model 8644A) was purchased specifically for these measurements. The calibrated signal was fed from the power output of the signal generator into a 13.81 meter length of RG 400 coaxial cable. This cable was in turn connected to the input to the TR switch. The insertion loss for this cable was measured at 340 MHz using a Hewlett Packard 4195A Network analyzer. At 340 MHz the insertion loss on the cable was 3.06 dB. As such, the inserted signal corresponds to −123.06 dB at 340 MHz. Spectroscopic parameter were as above (sweep width=30 k; block size=1 k real, 1 k imaginary; receiver gain=maximal). Under these condition, a signal-to-noise (SNR) (measured peak to peak) of at least 7:1 was observed. This once again can be considered excellent performance.

RF coil construction: Transverse Electromagnetic (TEM) RF coils were constructed following previously published procedures (8) for operation at 1.5 T, 4.0 T and 8.0 T. The TEM resonator is characterized with a cylindrical geometry. The surface of the cylinder is formed with a very thin copper sheet inlaid on an acrylic cylinder, while the two ends of the coil are open. As such, this coil is able to radiate some of the energy incident into its cavity. Tuning in these devices was achieved by adjusting the length of the copper stubs within the transmission line elements (see FIG. 1). The latter were constructed from Teflon tubes overlaid with thin copper foil. Note that the 4.0 T and 8.0 T TEM resonators operated in quadrature, while the 1.5 T resonator operated in linear mode.

In addition, black body resonators of the present invention were constructed for operation at both 4.0 and 8.0 T using a design modified from the TEM resonator. However, in this case, both ends of the resonator were capped with copper foil inlaid on 0.25" thick acrylic sheets (see FIG. 1). These end plates were attached to the cylindrical acrylic portion of the coil with brass screws. Because the ends of the black body resonator are capped, this device is actually unable to radiate. The only opening into the closed-cavity structure was in the form of a single 50 ohm line that fed the device. As such, the black body resonator operated in linear mode. In addition, note that the mineral oil phantom is trapped inside this resonator.

At 1.5 tesla, the TEM resonator was characterized with a Q value of 75 and a reflective loss of −31 dB for the water phantom. A Q value of 120 and a reflective loss of −35 dB was observed for the TEM resonator loaded with the mineral oil phantom. The performance characteristics of the TEM resonator versus the black body (BB) resonator at 4.0 T and 8.0 T are summarized in Table 1.

TABLE 1

Summary of RF Power, Energy, Q Values and Reflective Losses at 4.0 and 8.0 T.

| Field Strength (tesla) | 4.0 | 4.0 | 8.0 | 8.0 |
|---|---|---|---|---|
| Energy (mjoules) | 240 | ~1.0 | 85 | ~2.0 |
| Frequency (MHz) | 170.74 | 170.74 | 340.5 | 340.58 |
| Coil Type | TEM | BB | TEM | BB |
| Quality Factor (Q) | 265 | 800 | 85 | 1050 |
| Reflective Loss (RL) | −35 | −49 | −35 | −42 |
| 90° Pulse power (watts) | 240 | 0.4 | 90 | 1.53 |
| Pulse shape | square | square | sin ($\omega t$)/$\omega t$ | sin ($\omega t$)/$\omega t$ |
| 90° Pulse duration (msec) | 1.0 | 2.25 | 4.0 | 4.0 |
| 180° Pulse duration (msec) | 2.0 | 5.5 | 8.0 | 8.0 |

The sin ($\omega t$)/$\omega t$ pulse waveform was integrated from −2Π to 2Π.
TEM refers to a classic transverse Electromagnet
BB refers to the "Black Body" resonator of the present invention.

RF power measurements: The power required to achieve a 90° pulse was measured, using a single excitation. This was determined, in all cases, by the amount of power required to obtain a 180° pulse. This power was measured, not from an image, but from the amplitude of the free induction decay (FID), or its Fourier transform, following excitation. Images corresponding to the maximal (90°) and null (180°) excitation were then acquired by applying a simple gradient recalled echo imaging experiment. Once the power to determine the maximal excitation was established, the RF output at the RF coil was measured by sending the signal through a standard 50 ohm line, to a 30 dB high power attenuator and then to a 400 MHz oscilloscope. In order to report accurate power values, the insertion losses of the 50 ohm line and the 30 dB attenuator were measured on a network analyzer and utilized to report accurate voltages.

The power required to produce a 180° pulse in the black body resonator was determined as described in the preceding paragraph. However, the power requirements for spin excitation were so low for this RF coil type at 170 MHz, that a 30 dB attenuator was inserted into the transmission path in order to enable accurate measurement of the 180° pulse. At 340 MHz, a 10 dB attenuator was inserted into the transmission path. As such, RF power traveled from a 1–2.5 KW amplifier, to a 10 or 30 dB attenuator and then to the coil! The voltage produced at the scope was measured without use of an additional attenuator. The attenuation loss in the cable traveling between the RF coil and the oscilloscope was determined with a network analyzer.

Measurements of T1 and T2 values: Mineral oil is characterized by $T_1$ values of $96^{\pm}17$, $202^{\pm}30$ and $350^{\pm}20$ at 1.5 T, 4.0 T and 8.0 T respectively (9). In addition, we have measured a $T_2$ value for mineral oil of $80^{\pm}15$ at 8.0 tesla.

Selection of Mineral Oil: Mineral oil avoids the two most significant problems anticipated at 8 T in conventional water phantoms, namely RF penetration effects and the presence of dielectric resonances (9–14). Ashland Kaydol white mineral oil (heavy USP) is a distillate product (15) and is composed of hydrocarbon chains containing between 16 and 20 carbon atoms. With a relative permittivity of only 2.5 (measured from 0 to 150 MHz), mineral oil is unable to support any dielectric resonance from 63–340 MHz. In addition, mineral oil is not lossy (conductivity of <0.1 siemens/m) and consequently permits imaging at 340 MHz with a nearly uniform RF field. Mineral oil is characterized with a viscosity of 350 Saybolt seconds at 100° F., an average molecular weight on the order of 220–280 g/M, and a density of 0.875–0.905 gm/cc.

The $^1$H-NMR spectrum of mineral oil is characterized by a triplet located at 0.85 ppm (intensity=14) and a singlet at 1.26 ppm (intensity=30). Since the ratio of the 1.26 ppm singlet to the 0.8 ppm triplet is slightly more than 2, it is clear that chemical shift dispersion can modulate SNR significantly when mineral oil is utilized as a phantom. However, since the resonance positions of both lines in mineral oil is well understood, chemical shift effects can be readily quantified and accounted for in any study of ISNR with this sample. For this reason, we have conducted a thorough examination of ISNR as a function of echo times in mineral oil at 8.0 T.

Image processing: All images were processed using a Fermi filter, $W(k,i)=1/(1+e^{((r-FR)/FW)})$ where FR is the Fermi radius and FW is the Fermi width. This is a simple low-pass digital filter used to remove high frequency noise. The use of this filter is standard on a GE Signa scanner. For consistency, this filter was also applied to all 8 tesla images. The application of this filter improved image ISNR a factor of about 20% over the unprocessed image. In reporting image SNR, data are presented as mean$^{\pm}$standard deviations.

Results

RF Power measurements: The amount of power required to achieve a 90° spin excitation in an 18.5 cm mineral oil phantom has already been reported in part for the TEM resonator (9–14). As such, the new observation in this work relates to the amount of power required to achieve a 90° pulse in the black body radiator. Note that these devices have extremely high Q values on the order of 800 (see table 1). In addition, and most importantly, the black body resonators are incapable of radiative power loss. As such, they are the ideal possible resonator in term of signal-to-noise.

It has been previously been reported (9–14) that a 180° pulse at 4.0 T in the TEM resonator required a 2 msec 240 watts square pulse (240 mJoules of energy for the 90°). In sharp contrast, a mere 5.5 msec 0.4 watts square pulse (about 1 mJoule of energy for the 90°) was required to accomplish the same task in the black body resonator (see Table 1). Indeed, the power required for sample excitation was so low in the black body resonator at 4.0 tesla that a 30 dB high power attenuator was inserted into the transmission line such that we could operate the 1 kWatt amplifier at reasonable outputs. Note that a 240 fold decrease in energy is being reported here. Yet the ratio of the Q values for the black body radiator (Q=800) versus the TEM resonator (Q=190) would predict a drop in energy of only a factor of about 4. Clearly Q values cannot predict energy in this setting. If so, the black body resonator would have required at least 60 mJoules of energy for a 90° pulse. This was not the case.

At 8.0 tesla, it has been previously been reported (9–14) that a 180° pulse in the TEM resonator required a 4 msec 90 watt sinc pulse (85 mJoules of energy for the 90°). Once again in sharp contrast, a mere 4 msec 1.6 watts sinc pulse (about 2 mJoule of energy for the 90°) was required to accomplish the same task in the black body resonator (see table 1). This constitutes a 45 fold drop in energy, yet analysis of changes in the Q values only provides a factor of about 10. Once again, the amount of RF energy required for sample excitation in the black body resonator at 8.0 T cannot be predicted from changes in Q values.

At the same time, it is interesting to note that the amount of energy required to excite the entire sample in this case is very close to that calculated by applying equations for energy which only consider the spin system (9, 16).

Figure 5:
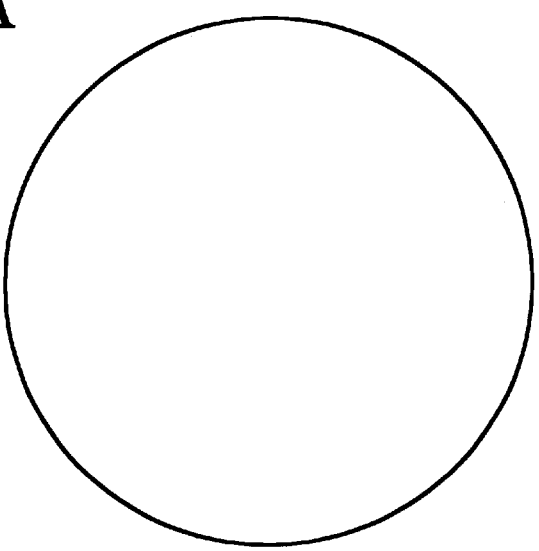
FIG. 5 shows spin-echo images acquired from (A) water and (B) mineral oil at 1.5 tesla. These images correspond to images 20 of Table 2.
Figure 5:
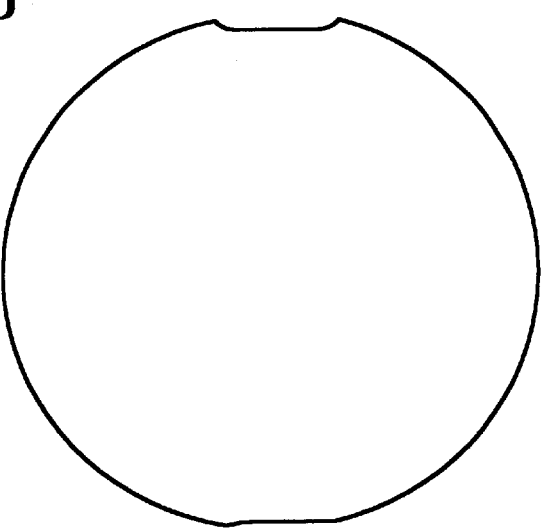

Intrinsic Signal-to-Noise: Extensive SNR measurements in water and mineral oil were conducted in the TEM resonator using gradient recalled echo, spin-echo and spoiled grass imaging sequences on a 1.5 T GE Signa scanner. Images were acquired using various slice thicknesses (10, 5 and 2.5 mm) and echo times (4.5, 8.4, 9.0 and 14.7 msec) in both water and mineral oil. These results have been summarized in Table 2. Representative water and mineral images are displayed in FIG. 5. FIG. 5 shows spin-echo images acquired from (A) water and (B) mineral oil at 1.5 tesla. These images correspond to images 20 of Table 2.

TABLE 2

SNR Summary For Water And Mineral Oil Images At 1.5 Tesla In The TEM Resonator

| Image No. | Sequence | Matrix Size | ST (mm.) | TE (ms) | SNR (water) | SNR (oil) |
|---|---|---|---|---|---|---|
| 1 | GRE | 256 × 256 | 10 | 4.5 | 225 +/− 7 | 224 +/− 15 |
| 2 | GRE | 256 × 256 | 5 | 4.5 | 158 +/− 10 | 138 +/− 5 |
| 3 | GRE | 256 × 256 | 2.5 | 4.5 | 87 +/− 3 | 85 +/− 2 |
| 4 | GRE | 256 × 256 | 10 | 8.4 | 192 +/− 17 | 153 +/− 7 |
| 5 | GRE | 256 × 256 | 5 | 8.4 | 129 +/− 10 | 93 +/− 4 |
| 6 | GRE | 256 × 256 | 2.5 | 8.4 | 78 +/− 2 | 50 +/− 2 |
| 7 | GRE | 256 × 256 | 10 | 14.7 | 184 +/− 6 | 84 +/− 5 |
| 8 | GRE | 256 × 256 | 5 | 14.7 | 123 +/− 4 | 42 +/− 2 |
| 9 | GRE | 256 × 256 | 2.5 | 14.7 | 74 +/− 4 | 22 +/− 1 |

TABLE 2-continued

SNR Summary For Water And Mineral Oil Images
At 1.5 Tesla In The TEM Resonator

| Image No. | Sequence | Matrix Size | ST (mm.) | TE (ms) | SNR (water) | SNR (oil) |
|---|---|---|---|---|---|---|
| 10 | GRE | 256 × 128 | 10 | 4.5 | 301 +/− 30 | 284 +/− 20 |
| 11 | GRE | 256 × 128 | 5 | 4.5 | 220 +/− 6 | 200 +/− 13 |
| 12 | GRE | 256 × 128 | 2.5 | 4.5 | 126 +/− 6 | 110 +/− 7 |
| 13 | GRE | 256 × 128 | 10 | 8.4 | 240 +/− 40 | 230 +/− 15 |
| 14 | GRE | 256 × 128 | 5 | 8.4 | 189 +/− 6 | 139 +/− 10 |
| 15 | GRE | 256 × 128 | 2.5 | 8.4 | 111 +/− 1 | 71 +/− 2 |
| 16 | GRE | 256 × 128 | 10 | 14.7 | 220 +/− 35 | 109 +/− 10 |
| 17 | GRE | 256 × 128 | 5 | 14.7 | 169 +/− 10 | 62 +/− 4 |
| 18 | GRE | 256 × 128 | 2.5 | 14.7 | 104 +/− 2 | 32 +/− 2 |
| 19 | SE | 256 × 256 | 10 | 9 | 192 +/− 4 | 208 +/− 13 |
| 20 | SE | 256 × 256 | 5 | 9 | 135 +/− 3 | 134 +/− 7 |
| 21 | SE | 256 × 256 | 2.5 | 9 | 87 +/− 3 | 71 +/− 6 |
| 22 | SE | 256 × 256 | 10 | 14.7 | 167 +/− 3 | 147 +/− 7 |
| 23 | SE | 256 × 256 | 5 | 14.7 | 120 +/− 7 | 98 +/− 6 |
| 24 | SE | 256 × 256 | 2.5 | 14.7 | 68 +/− 1 | 55 +/− 3 |
| 25 | SPGR | 256 × 256 | 10 | 14.7 | 182 +/− 8 | 81 +/− 3 |
| 26 | SPGR | 256 × 256 | 5 | 14.7 | 115 +/− 11 | 43 +/− 1 |
| 27 | SPGR | 256 × 256 | 2.5 | 14.7 | 73 +/− 3 | 21 +/− 1 |

TEM refers to a classic transverse Electromagnet
BB refers to the "Black Body" resonator of the present invention.

Table 2 reveals that little SNR differences exist between water and mineral oil at echo times of 4.5, 8.4 and 9 msec (images 1, 2, 3, 4, 5, 6, 10, 11, 12, 13, 14, 15, 19, 20, 21; Table 2). However, considerable variation is observed in the gradient recalled echo and spoiled grass images obtained in water and mineral oil at 14.7 msec (images 7, 8, 9, 16, 17, 18, 25, 26 and 27; Table 1). This constitutes a reflection of the chemical shift dispersion within mineral oil. This is because the two resonance lines of mineral oil become completely antiphase at 17.2 msec in a 1.5 T scanner. Note, as expected, that much of the chemical shift effect observed in the images obtained at 14.7 msec is removed in the corresponding spin echo images (images 22, 23, 24; Table 2). Indeed, while the 10 mm gradient recalled echo and spoiled grass images (image 7, 16 and 25; Table 2) differed by more than a factor of 2 in SNR, the spin echo images (image 22; Table 2) differ by little more than their standard deviations.

It is also interesting to examine the effect of reducing slice thickness on SNR. Clearly, a linear relationship does not exist on the Signa between slice thickness and signal. Indeed, all images obtained at a 10 mm slice thickness have less inherent SNR than predicted from the 2.5 mm and 5 mm images. This is likely to be caused by the automatic optimization of receiver gains by the console prior to image acquisition. Alternatively, it is also possible that slice profiles are not exactly identical as a function of slice thickness. Nonetheless, it appears that when taken in combination, the 1.5 T images obtained in both water and mineral oil with a 1 cm slice thickness are setting a lower bound for SNR of approximately 210:1 (256×256, 10 mm, 16 kHz bandwidth). This SNR can be normalized to a bandwidth of 32 KHz by dividing this value by 1.414. Bandwidth normalization permits direct comparison with the 4.0 and 8.0 tesla images. Once the bandwidth correction is applied an ISNR of approximately 140–150:1 (256×256, 10 mm, 32 KHz bandwidth) is obtained for water and mineral oil at 1.5 tesla. Note that corrections for T1 and T2 are not necessary in this case since short echo times (TE=4.5 msec) and relatively long repetition times (TR=1000 msec; T1=202"30 msec) were utilized in obtaining the images of interest.

Unfortunately, since unrestricted access to a 4.0 T scanner was not available for these studies, only limited SNR results can be presented at this field strength. In addition, the performance of this spectrometer could not be documented for these studies. Nonetheless, a gradient recalled echo 4.0 T mineral oil image was nonetheless obtained with a TEM resonator. This image was acquired with a 24 cm field of view and a 31.3 kHz bandwidth. The matrix size was 256×128 collected with a TE of 4.5 msec and a TR of 1000 msec. Under these conditions, SNR of 240:1 was obtained. When this result is normalized to a 256×256 matrix size, this actually translates to an SNR of 170:1.

At 4.0 T, the chemical shift dispersion of mineral oil causes the two resonances within this sample to be perfectly antiphase at 7.2 msec. The two resonances are at 90 to each other at 3.6 msec. As such, the mineral oil image described above 4.5 msec echo times has significantly reduced in intensity due to chemical shift dispersion. Indeed, a correction on the order of 50% to account for chemical shift dispersion in mineral oil at 4.0 T and a 4.5 msec echo time would not be judged excessive (see Table 3, chemical shift dispersion effect at 8.0 T as a function of echo times). As a result, we can estimate an ISNR of at least 255:1 for mineral oil at 4.0 T (256×256, 10 mm, 32 kHz bandwidth). Note that corrections for T1 and T2 are not necessary in this case since short echo times and long repetition times were utilized to acquire this image.

Figure 6:
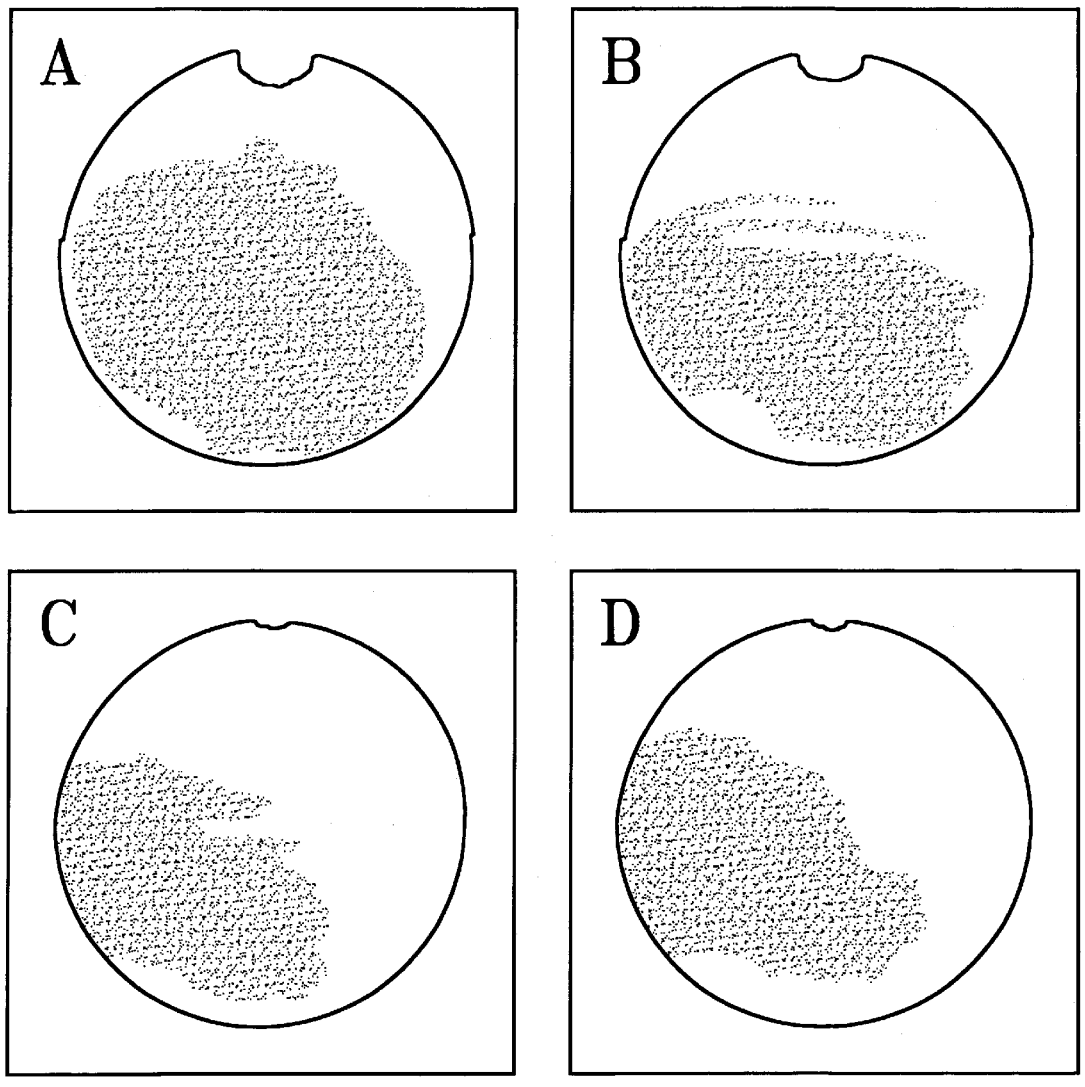
FIG. 6 shows gradient recalled echo images (A, B) and spin-echo images (C, D) acquired from mineral oil at 8.0 T using the TEM resonator. These images correspond respectively to images 20(A), 21(B), 23(C) and 24(D) of Table 3.
Figure 7:
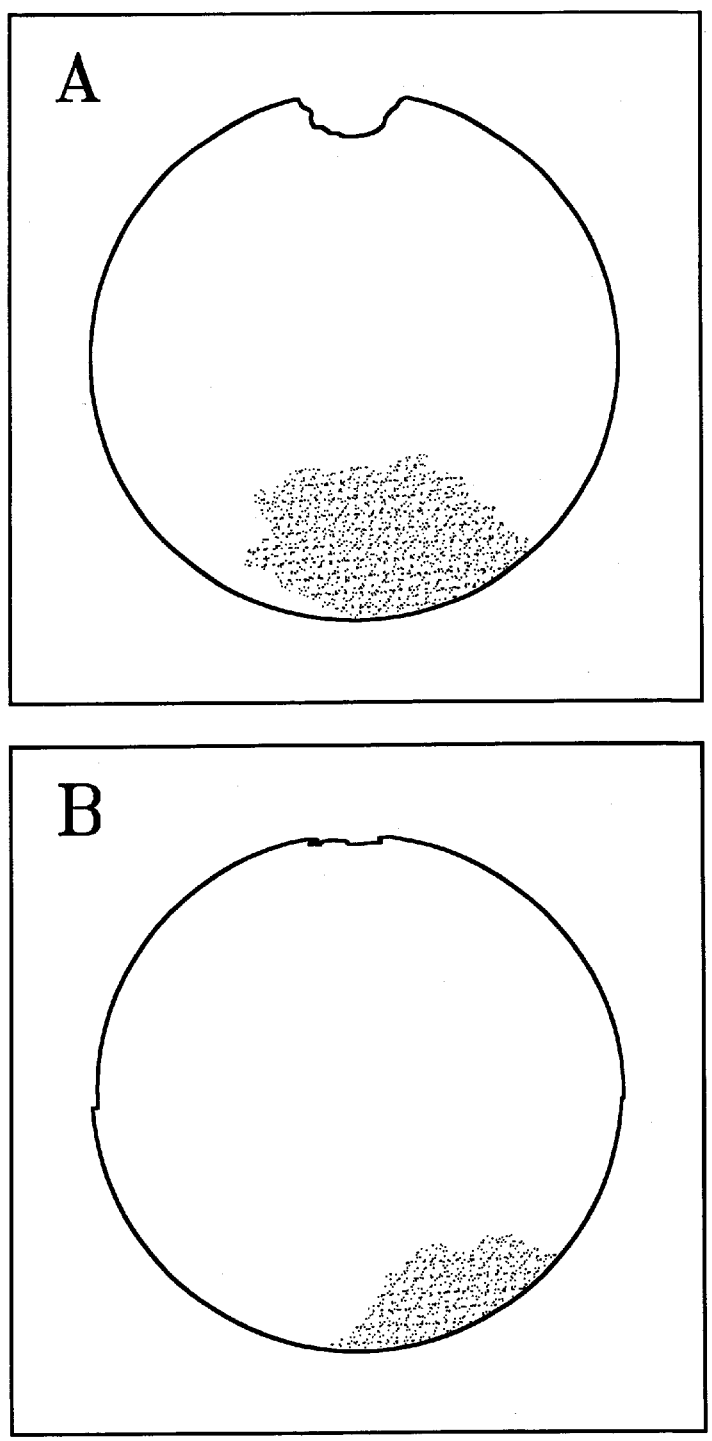
FIG. 7 shows gradient recalled echo image (A) and spin-echo image (B) acquired from mineral oil within the black body resonator at 8.0 T. These images correspond respectively to images 26 and 27 within Table 3.

Table 3 also summarizes results obtained at 8.0 T in mineral oil using both TEM and black body resonators. In addition, gradient recalled echo and spin-echo mineral oil images obtained in both the black body radiator and the TEM radiator at 8.0 T are presented in FIG. 6. FIG. 6 shows gradient recalled echo images (A, B) and spin-echo images (C, D) acquired from mineral oil at 8.0 T using the TEM resonator. These images correspond respectively to images 20(A), 21(B), 23(C) and 24(D) of Table 3. FIG. 7 shows gradient recalled echo image (A) and spin-echo image (B) acquired from mineral oil within the black body resonator at 8.0 T. These images correspond respectively to images 26 and 27 within Table 3.

TABLE 3

SNR Summary For Mineral Oil Images At 8.0 tesla
In The TEM And Black Body Resonators

| Image No. | Coil Type | Sequence | Bandwidth | ST (mm.) | TR (ms) | TE (ms) | SNR |
|---|---|---|---|---|---|---|---|
| 1 | TEM | GRE | 100 k | 5 | 1000 | 7.4 | 67 +/− 3 |
| 2 | TEM | GRE | 100 k | 5 | 1000 | 7.9 | 62 +/− 2 |
| 3 | TEM | GRE | 100 k | 5 | 1000 | 8.4 | 54 +/− 2 |
| 4 | TEM | GRE | 100 k | 5 | 1000 | 8.9 | 48 +/− 2 |
| 5 | TEM | GRE | 100 k | 5 | 1000 | 9.4 | 37 +/− 1 |
| 6 | TEM | GRE | 100 k | 5 | 1000 | 9.9 | 27 +/− 1 |
| 7 | TEM | GRE | 100 k | 5 | 1000 | 10.4 | 15 +/− 1 |
| 8 | TEM | GRE | 100 k | 5 | 1000 | 10.9 | 10 +/− 1 |
| 9 | TEM | GRE | 100 k | 5 | 1000 | 11.4 | 15 +/− 2 |
| 10 | TEM | GRE | 100 k | 5 | 1000 | 11.9 | 28 +/− 2 |
| 11 | TEM | GRE | 100 k | 5 | 1000 | 12.0 | 24 +/− 2 |
| 12 | TEM | GRE | 100 k | 5 | 1000 | 12.4 | 42 +/− 3 |
| 13 | TEM | GRE | 100 k | 5 | 1000 | 12.9 | 47 +/− 3 |
| 14 | TEM | GRE | 100 k | 5 | 1000 | 13.4 | 54 +/− 3 |
| 15 | TEM | GRE | 100 k | 5 | 1000 | 13.9 | 57 +/− 3 |
| 16 | TEM | GRE | 100 k | 5 | 1000 | 14.4 | 59 +/− 3 |
| 17 | TEM | GRE | 100 k | 5 | 1000 | 14.7 | 52 +/− 3 |
| 18 | TEM | GRE | 100 k | 5 | 1500 | 14.9 | 47 +/− 2 |
| 19 | TEM | GRE | 32 k | 10 | 1500 | 14.7 | 173 +/− 13 |
| 20 | TEM | GRE | 32 k | 5 | 1500 | 14.7 | 96 +/− 6 |
| 21 | TEM | GRE | 32 k | 2.5 | 1500 | 14.7 | 48 +/− 3 |
| 22 | TEM | GRE | 32 k | 1.4 | 1500 | 14.7 | 26 +/− 2 |
| 23 | TEM | SE | 32 k | 5 | 1500 | 14.7 | 65 +/− 7 |
| 24 | TEM | SE | 32 k | 2.5 | 1500 | 14.7 | 40 +/− 4 |
| 25 | TEM | SE | 32 k | 1.4 | 1500 | 14.7 | 27 +/− 3 |

TABLE 3-continued

SNR Summary For Mineral Oil Images At 8.0 tesla
In The TEM And Black Body Resonators

| Image No. | Coil Type | Sequence | Bandwidth | ST (mm.) | TR (ms) | TE (ms) | SNR |
|---|---|---|---|---|---|---|---|
| 26 | BB | GRE | 32 k | 2.5 | 500 | 14 | 133 +/- 6 |
| 27 | BB | SE | 32 k | 2.5 | 500 | 14 | 95 +/- 7 |

TEM refers to a classic transverse Electromagnet
BB refers to the "Black Body" resonator of the present invention.

At 8.0 T a careful analysis of the effect of chemical shift dispersion in mineral oil was conducted (images 1–18; Table 3). Gradient recalled echo images were acquired using variable TE values (0.5 msec steps) from 7.4 msec to 14.9 msec. At 8.0 T, the two resonances of mineral oil become completely antiphase at 3.6, 10.8, 17.9 msec. Maximum signal on the other hand is expected at 7.2 msec and 14.3 msec. Note that the results in Table 3 exactly confirm this behavior. As such, images obtained at an echo time of 14.7 msec contains 95% of the expected signal from mineral oil at this field strength, neglecting T2 effects. However, by comparing images 1 (TE=7.4; SNR=67$^\pm$3) and 16 (TE=14.4; SNR=59$^\pm$3) one can safely multiply images obtained with a TE=14.7 by a factor of 1.2 to account for T2 losses in mineral oil at 8.0 telsa at this echo time. As such, image 19 can be normalized to 207$^\pm$116 (173$^\pm$1.2) to account for T2 losses.

As such, the ISNR for mineral oil at 8.0 T is 207$^\pm$16. Note that these results are intermediate between the ISNR calculated for 1.5 T (140–150:1) and that calculated for 4.0 T (255:1). Indeed, it is difficult to believe that an 8.0 T instrument could have an ISNR which is only 30% better than a 1.5 T magnet and actually 20% worst than a 4.0 T system.

Interestingly however, the black body resonator provided improved SNR over the conventional TEM resonator. Indeed, an SNR of 133 was obtained for the black body resonator on a 0.25 cm slice using a gradient recalled echo image (image 26; Table 3). Correspondingly, an SNR of 95 was obtained with a spin echo imaging sequence using the same resonator (image 27; Table 3). When correcting for slice thickness (a factor of 4), repetition times (a factor of about 1.3 since TR=500 and T1=350) and echo times (a factor of about 1.2) an ISNR of about 600 and 800 are obtained for the spin echo and gradient recalled echo images respectively. While a correction by a factor of 4 may be a little generous to compensate for slice thickness based on data presented in Tables 2 and 3, it can nonetheless be noted that phenomenal ISNRs (on the order of 600–800) are obtained in the black body resonator using less than 2 mJoules of energy for the 8.0 tesla! Importantly in this case, however, the SNR for both images were obtained with a coil having a Q of 1050. Clearly, such a Q will never be achieved in studying the human head. As such, this SNR result is related to the phenomenal Q of these resonators, and not to the inherent signal-to-noise of the 8.0 T magnet.

Discussion

RF Power: The fundamental observation that RF power required for spin excitation at 8.0 T is lower than that observed at 4.0 T and 4.7 T using the TEM resonator (9–14). As a review, it is noted that in the conventional TEM resonator, 240 mJoules are required for a 90° pulse at 4.0 T. Of this energy, only approximately 17% can be accounted for by RF coil radiative losses according to electromagnetic field analysis (9). NMR theory on the other hand predicts that only about 1 watt should be utilized to excite the spins contained within the mineral oil (9, 15). As such, it appears that in the TEM resonator, nearly 200 watts are dissipated into the lattice which surround the spins.

Most interestingly, it is now reported that at 4.0 T only 1 mJoule is required for a 90° pulse within the black body resonator. The energy required within this sealed cavity for a 90° pulse therefore drops by a factor of 240! This occurs in spite of the fact that the Q value for this coil is only a little more than 4 times higher than that for the conventional TEM resonator. As a result, this finding cannot be explained by improvements in coil quality factor. At 4.0 T, the TEM resonator requires 240 mJoules for a 90° pulse, and the black body resonator requires only 1 mjoule. The differences in Q values would predict a pulse energy requirement for the closed coil of approximately 60 mjoules at 4.0 T. This was clearly not the case.

It is interesting that the amount of energy required for spin excitation in the closed cavity resonator at both 4.0 T and 8.0 T was extremely close to the amount of energy predicted by current NMR theory [9, 16]. However, much more energy was required when the radiation of the coil and the sample were not confined [9–14]. Presumably, much of this excess energy is being consumed by the lattice, as previously described [9].

It is noted once again that in the black body resonator radiation can only enter and leave the device through a single small port. As such, the RF coil and the sample are perfectly absorbing, much like a black-body. Interestingly however, under these conditions, the lattice appears unable to absorb energy directly from the RF source. Although not limited to the theory of the invention, this may be because lattice is being prevented from radiating freely.

This phenomenal result begs interpretation. In the simplest analysis, it appears that the lattice of the sample within the black body radiator is no longer able to absorb RF. That is because only 1 mJoule is required for the 90° pulse in this device at 4.0 T. This is approximately the amount that should be required if only the spins absorbed energy. As such, it might relatively safely be advanced that the lattice may no longer be able to absorb energy in this setting. Since absorption and emission must be equal at all times, this implies that the lattice can no longer radiate. If it is indeed true that lattice cannot radiate, this brings significant questions regarding thermal noise within the sample.

It now appears that the power density spectrum in NMR is dominated fundamentally by the thermal nature of the liquids in a manner analogous to Planck's analysis for solids, nearly 100 years ago (7). Indeed, the fact that RF power drops as a function of frequency in this range, even with a conventional TEM resonator, is likely to constitute for the NMR spectroscopist the first direct evidence from the power density spectrum that NMR is indeed a reflection of the thermal nature of liquids. Nonetheless, the thermal nature of NMR has long been recognized and it is for this reason that Felix Bloch, in the earliest days of NMR, referred to the longitudinal relaxation time (T1) as the "Thermal Relaxation Constant" (17).

It is interesting that the study of thermal processes has now led to the construction of the black body radiator. The construction of this device was conceived after consideration of Planck's model of a black body. This black body had only one small hole from which radiation could either enter or be emitted. In an analogous manner, the black body resonator contains a thermal sample (which in this case is a ball containing mineral oil). It also has only one RF port from which radiation can either enter or exit the cavity. As such, note that the black body resonator greatly limits radiation by the sample (since the sample is now completely enclosed). In addition, radiation by the coil itself is now completely eliminated.

The ISNR findings indicate that the black body resonator has nearly four times the ISNR as the conventional TEM resonator. As such, appears that a sealed black body resonators would greatly enhance the ISNR performance of all devices requiring such electromagnetic resonators, including high resolution spectrometers. In accordance with the present invention, the electromagnetic resonators of the present invention may be built within the shield and any type of efficient means for inserting the sample may be used. However, the exact nature of the resonating device (TEM, saddle, Alderman-Grant) is not a limitation to the invention.

In addition, since power is drastically reduced in the black body resonator of the present invention, power intensive areas such as solid state NMR could greatly benefit from its implementation. The same can be said for high resolution NMR, since we have uncovered that these instruments require tremendous power at frequencies near 200 MHz (carbon decoupling on an 800 MHz instrument, for instance). Perhaps the black body radiator will also have a role in medicine. Clearly, a drastic decrease in SARs at 1.5, 3.0 and 4.0 tesla would be beneficial. This will prevent exposing patients unnecessarily to the risk of RF burns.

Yet perhaps more fascinating lies in what is happening inside this device. Again, although not limited by theory, it appears that the lattice within this device is prevented from absorbing RF power, and therefore appears unable to radiate. This condition can be viewed as the antithesis of what is happening in a light bulb. That is because, in a light bulb radiation is promoted, whereas in the black body resonator radiation is suppressed.

At the same time, it is interesting to consider that, since NMR is indeed a thermal process (17), its absorption characteristics should follow a Planck-like shape (7) when a conventional open resonator is utilized. That is, because heat transfer occurs through radiative processes in NMR. In other words, when spins are excited, photons are transmitted which carry energy at the proper frequency for absorption by the spin system, although much of this energy is also being absorbed by the lattice. Indeed, the lattice is critically important in this process. This might also explain the quadratic increase in power with field strength observed at lower frequencies in NMR. This quadratic increase in power has been observed for thermal processes in solids at lower frequencies when infrared experiments were conducted at the end of the last century (1, 2). However, once a maximal absorption was reached, experimental measurements (1, 2) and Planck's law (7) indicated that an exponential decrease in power will be observed with increasing frequency. The NMR process has now confirmed this behavior in liquids samples in the radio frequency range (9–14).

While NMR is often analyzed only in terms of quantum mechanics a complete picture of this process can only be obtained when fundamental thermodynamics are also considered. When power is measured as a function of field strength in NMR using an open resonator, the spectroscopist is actually obtaining a power density spectrum. This spectrum is completely analogous in nature to that reported for solids at the end of the century, with the notable exception that we are dealing with liquids. However, it is clear that if NMR could be performed in solids at infrared frequencies (such magnets will be a long time in coming), that the power density spectrum would not be dominated by the RF coil or the NMR hardware. Fundamentally, since the sample is a solid, its power density spectrum would correspond to the power density spectrum for solids in a manner linked to previously published thermal curves (1, 2). Clearly, this fact has not been considered by the NMR spectroscopist. That is why the result that power was reduced at 8.0 T even with the TEM resonator was such an incomprehensible finding. Indeed, the fact that the amount of power reported to achieve spin excitation at 8.0 T is fundamentally reduced versus 4.0 T cannot be predicted using electromagnetic principles alone. Nonetheless, Planck (7) and thermodynamics seem to be telling the NMR community that power will not continue to increase quadratically with field strength in a Rayleigh (5) and Jeans (6) catastrophic manner. Indeed, this would have constituted a violation of fundamental thermodynamics. Unfortunately, it also appears that a reduction in power is also fundamentally associated with a decrease in predicted signal-to-noise. As such, a finding that was met with such delight (a fundamental reduction in power) was associated with less pleasing consequences (a fundamental decrease in intrinsic signal-to-noise).

Accordingly, the resonator of the present invention might also be useful for applications in the fields of thermodynamics and fundamental physics, such as in other electronic applications when radiation is to be limited.

REFERENCES

1. Langley S. P., On Hitherto Unrecognized Wave-lengths. Phil. Mag. 22, p. 149–173 (1886).
2. Langley S. P., Sur les Spectres Invisibles. Annales Chimie Physique. 8, 433–506 (1886).
3. Stefan, J. Über die Beziehung zwischen der Warmestrahlung und der Temperatur. Wein. Akad. Sitzber. 79, 391–428 (1879).
4. Wien W., Über die Energieverteilung im Emissionspektrum emes schwarzen Körpers. Annalen der Physik, 58, 662–669 (1896).
5. Rayleigh L., Remarks on the Law of Complete Radiation. Phil. Mag., 49, 539–540 (1900).
8. Jeans L. H. On the Partition of Energy between Matter and the Ether. Phil. Mag. 10, 91–97 (1905).
7. Planck M., Über das Gesetz der Energieverteilung in Normaispectrum, Annalen der Physik, 4, 3 553–563 (1901).
8. Vaughan J. T., Hetherington H. P., Otu J. O., Pan J. W., Pohost G. M. High Frequency Volume Coils for Clinical NMR Imaging and Spectroscopy. Magn. Reson. Med. 32, 206–218 (1994).
9. Robitaille, P-M. L., Kangarlu, A. and Abduljalil A. M. Implications of the First Measurements in a Whole-Body 8 Tesla Magnet, submitted.
10. Robitaille, P-M. L., Magnetic Imaging and Spectroscopy at Very High Magnetic Fields: A Step Towards 8 Tesla. Physical Phenomena at High Magnetic Fields-III (National High Field Laboratory, October 24–27th, Tallahasse, Fla.), Plenary Lecture.
11. Robitaille, P-M. L. Kangarlu A., Abduljalil A. M., Zhang X., Bair S., Ibrahim T., Lee R. and Baertlein B. On the Thermal Nature of NMR: Human Imaging at 8 Tesla. 18th ICMRBS (Aug 24–27, 1998), Tokyo, Japan.
12. Robitaille, P-M. L., Kangarlu, A and Abduljalil, A. M. On Power Requirements in Magnetic Resonance Imaging, 18th ICMRBS (Aug. 24–27, 1998), Tokyo, Japan.
13. Robitaille, P-M. L. Kangarlu, A. and Abduljalil, A. M. On Power Requirements in Magnetic Resonance Imaging, European Society of Magnetic Resonance in Medicine and Biology (15$^{th}$ Annual Meeting, Geneva, Switzerland), abs 96.
14. Robitaille, P-M. L. Kangarlu A. and Abduljalil A. M., Zhang X., Chakeres D. M. Acquisition of the First Human MRI Images at 4.7 and 8.0 Tesla: From Concept to Reality. Resonance Imaging, European Society of Magnetic Resonance in Medicine and Biology (15$^{th}$ Annual Meeting, Geneva, Switzerland), abs 84.
15. Budavari S., The Merck Index, 11$^{th}$ edition, Merck and Co, Rahway, N.Y. p.1139 (1989).
16. Abragam A. Principles of Nuclear Magnetism (Oxford Science Publication, Oxford, 1994).
17. Block F., Nuclear Induction. Phys. Rev. 70, 460–485 (1946).
18. Wen H., Denison J. T., Singerman R. W., and Balaban R. S., The Intrinsic Signal to Noise in Human Cardiac Imaging at 1.5, 3, and 4 T. J. Magn. Reson. 125, 65–71 (1997).
19. Bottomley P. A. and Eldelstein W. A. Power Deposition in whole-body NMR Imaging. Med. Phys. 8, 510–512 (1981).
20. Hoult D. I. and Richards R. E. The Signal to Noise of the Nuclear Magnetic Resonance Experiment. J. Magn. Reson. 24, 71 (1976).

The Foregoing References are Hereby Incorporated Herein by Reference in their Entirety The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

What is claimed is:

1. An electromagnetic resonator device comprising:
   (1) a sealed resonance cavity comprising at least one electromagnetic radiation port adapted to allow the passage of electromagnetic energy into and out of said cavity;
   (2) a source of electromagnetic energy to supply said cavity with electromagnetic energy; and
   (3) a receiver adapted to receive electromagnetic radiation from said cavity.

2. An electromagnetic resonator device according to claim 1 additionally comprising at least one impedance matching element and wherein said at least one impedance matching element is adapted to match the impedance of said cavity to the impedance of said receiver.

3. An electromagnetic resonator device according to claim 1 additionally comprising at least one resonance element contained within said cavity.

4. An electromagnetic resonator device according to claim 3 additionally comprising at least one impedance matching element and wherein said at least one impedance matching element is adapted to match the impedance of said at least one resonance element to the impedance of said source of electromagnetic energy.

5. An electromagnetic resonator device according to claim 3 additionally comprising a receiver adapted to receive electromagnetic radiation from said cavity.

6. An electromagnetic resonator device according to claim 5 additionally comprising at least one impedance matching element and wherein said at least one impedance matching element is adapted to match the impedance of said at least one resonance element to the impedance of said receiver.

7. An electromagnetic resonator device according to claim 3 wherein said at least one resonance element is selected from the group consisting of transverse electromagnetic resonators and bird-cage-type electromagnetic resonators.

8. A nuclear magnetic resonance device comprising an electromagnetic resonator device according to claim 1.

9. An electron spin resonance device comprising an electromagnetic resonator device according to claim 1.

10. A magnetic resonance imaging device comprising an electromagnetic resonator device according to claim 1.

11. An electromagnetic resonance system comprising:
   (1) a sealed resonance cavity comprising at least one electromagnetic radiation port adapted to allow the passage of electromagnetic energy into and out of said cavity;
   (2) at least one resonance element contained within said cavity;
   (3) a source of electromagnetic energy to supply said cavity with electromagnetic energy; and
   (4) a receiver adapted to receive electromagnetic radiation from said cavity; and
   (5) wherein said cavity is under the influence of a magnetic field.

12. An electromagnetic resonance system according to claim 11 additionally comprising at least one at least one impedance matching element and wherein said at least one impedance matching element is adapted to match the impedance of said at least one resonance element to the impedance of said source of electromagnetic energy or to the impedance of said to receiver.

13. An electromagnetic resonance system according to claim 11 wherein said at least one resonance element is selected from the group consisting of transverse electromagnetic resonators and bird-cage-type electromagnetic resonators.

14. An electromagnetic resonance system according to claim 11 wherein said source of electromagnetic energy comprises a source of radio frequency electromagnetic energy.

15. A nuclear magnetic resonance device comprising an electromagnetic resonance system according to claim 11.

16. An electron spin resonance device comprising an electromagnetic resonance system according to claim 11.

17. An electromagnetic resonator device comprising:
   (1) a sealed resonance cavity comprising at least one electromagnetic radiation port adapted to allow the passage of electromagnetic energy into and out of said cavity;
   (2) a source of electromagnetic energy to supply said cavity with electromagnetic energy;
   (3) at least one resonance element contained within said cavity; and
   (4) a receiver adapted to receive electromagnetic radiation from said cavity.

18. A magnetic resonance imaging device comprising:
(1) a sealed resonance cavity comprising at least one electromagnetic radiation port adapted to allow the passage of electromagnetic energy into and out of said cavity;
(2) at least one resonance element contained within said cavity;
(3) a source of electromagnetic energy to supply said cavity with electromagnetic energy; and
(4) a receiver adapted to receive electromagnetic radiation from said cavity.

* * * * *

UNITED STATES PATENT AND TRADEMARK OFFICE
CERTIFICATE OF CORRECTION

PATENT NO. : 6,255,816 B1  Page 1 of 1
DATED : July 3, 2001
INVENTOR(S) : Pierre-Marie L. Robitaille It is certified that error appears in the above-identified patent and that said Letters Patent is hereby corrected as shown below:

<u>Column 2,</u>
Line 60, after the word "those", please insert the symbol "/".

<u>Column 11,</u>
Line 32, please delete "Table 1" and insert -- Table 2 --.

<u>Column 15,</u>
Line 56, please delete the word "liquids" and insert the word -- liquid --.

Signed and Sealed this

Twenty-ninth Day of January, 2002

Attest:

JAMES E. ROGAN
*Attesting Officer*  *Director of the United States Patent and Trademark Office*